(12) United States Patent
Yamamoto et al.

(10) Patent No.: US 7,887,919 B2
(45) Date of Patent: Feb. 15, 2011

(54) AMORPHOUS-CARBON-BASED HARD MULTILAYER FILM AND HARD SURFACE MEMBER HAVING THE FILM ON SURFACE

(75) Inventors: Kenji Yamamoto, Kobe (JP); Katsuhiro Matsukado, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 874 days.

(21) Appl. No.: 11/670,161

(22) Filed: Feb. 1, 2007

(65) Prior Publication Data
US 2007/0254187 A1 Nov. 1, 2007

(30) Foreign Application Priority Data
Apr. 27, 2006 (JP) ............................. 2006-123668

(51) Int. Cl.
*B32B 9/00* (2006.01)
(52) U.S. Cl. .................. 428/408; 428/212; 428/698
(58) Field of Classification Search ................. 428/212, 428/408, 469, 698
See application file for complete search history.

(56) References Cited

U.S. PATENT DOCUMENTS

| 4,734,339 | A | * | 3/1988 | Schachner et al. ........... 428/469 |
| 5,260,107 | A | | 11/1993 | Kawamura et al. |
| 5,629,086 | A | | 5/1997 | Hirano et al. |
| 5,662,999 | A | * | 9/1997 | Taniguchi et al. ........... 428/408 |
| 6,372,303 | B1 | * | 4/2002 | Burger et al. ................ 427/577 |
| 6,740,393 | B1 | * | 5/2004 | Massler et al. .............. 428/698 |
| 6,821,624 | B2 | * | 11/2004 | Utsumi et al. ............... 428/408 |

(Continued)

FOREIGN PATENT DOCUMENTS

CN    1390667 A    1/2003

(Continued)

OTHER PUBLICATIONS

U.S. Appl. No. 11/844,846, filed Aug. 24, 2007, Yamamoto et al.

(Continued)

*Primary Examiner*—Archene Turner
(74) *Attorney, Agent, or Firm*—Oblon, Spivak, McClelland, Maier & Neustadt, L.L.P.

(57) ABSTRACT

An amorphous carbon (DLC) film having excellent adhesion at high temperature is provided. An amorphous-carbon-based hard multilayer film, which is formed on a surface of a substrate, includes a base layer formed at a substrate side, a surface layer formed at a surface side, and a compositional gradient layer formed between the base layer and the surface layer, wherein the base layer includes a nitride or a carbonitride of an element M expressed by the following formula (1), the surface layer includes an amorphous carbon film containing C of 50 atomic percent or more, and the compositional gradient layer is a layer in which the element M and nitrogen are decreased, and carbon is increased from the base layer to the amorphous carbon film:

$$M_{1-x-y}C_xN_y \quad (1),$$

(wherein M is at least one selected from a group 4A element in the periodic table, a group 5A element, a group 6A element, Al, and Si, and x and y denote atomic ratios in the formula, and x is 0.5 or less, y is 0.03 or more, and 1-x-y is more then 0).

10 Claims, 1 Drawing Sheet

U.S. PATENT DOCUMENTS 6,881,475 B2 * 4/2005 Ohtani et al. ............... 428/212

FOREIGN PATENT DOCUMENTS

| CN | 1743503 A | 3/2006 |
| --- | --- | --- |
| DE | 100 18 143 A1 | 10/2001 |
| EP | 0 503 822 B2 | 9/1992 |
| EP | 0 990 061 B1 | 4/2000 |
| EP | 1067211 * | 1/2001 |
| JP | 8-74032 | 3/1996 |
| JP | 2000-256850 | 9/2000 |
| JP | 2002-88465 | 3/2002 |
| JP | 2003-171758 | 6/2003 |

OTHER PUBLICATIONS

Yin-Yu Chang, et al., "Catalysis effect of metal doping on wear properties of diamond-like carbon films deposited by a cothodic-arc activated deposition process", Thin Solid Films, vol. 420-421, XP-004397852, Dec. 2, 2002, pp. 241-247.

\* cited by examiner

AMORPHOUS-CARBON-BASED HARD MULTILAYER FILM AND HARD SURFACE MEMBER HAVING THE FILM ON SURFACE

BACKGROUND OF THE INVENTION

1. Field of the Invention

The present invention relates to a member (hard surface member) having a hard coating such as a sliding component of a machine, and a cutting tool.

2. Description of the Related Art

An amorphous carbon film is known as a hard coating. Amorphous carbon has an intermediate structure between diamond and graphite carbon being mixed with each other, and may be called hard amorphous carbon, formless carbon, hard formless carbon, i-carbon, or diamond like carbon (DLC). Since the amorphous carbon (hereinafter, sometimes called DLC) has high hardness as diamond, and has excellent wear resistance, solid lubricating ability, heat conductivity, and chemical stability, it is being used for protective films for various components such as sliding members, dies, cutting tools, wear-resistant machine parts, abradants, and magnetic/optical components. In particular, the amorphous carbon (DLC) is practically used for a coating of a cutting tool for an aluminum or cupper material by making a use of properties of the amorphous carbon (DLC) such as chemical inertness, and less reactiveness with nonferrous metals. However, on the other hand, the excellent chemical stability of an amorphous carbon (DLC) film means low adhesion of the film to various kinds of substrates.

To improve adhesion between the amorphous carbon (DLC) film and a substrate, it has been proposed that an intermediate layer is formed between the amorphous carbon (DLC) film and a substrate (Japanese Patent Laid-Open No. H8-74032 (claims and paragraph 0007), Japanese Patent Laid-Open No. 2003-171758 (claims) and the like). In Japanese Patent Laid-Open No. H8-74032 (claims and paragraph 0007), when carbon is evaporated on a substrate, an inert gas is irradiated on the substrate, thereby a mixed layer (metal carbide layer or ceramic carbide layer) including a substrate material (metal or ceramics) and carbon is formed, then the amorphous carbon (DLC) film is formed. Japanese Patent Laid-Open No. 2003-171758 (claims) proposes an intermediate layer having a 4-layer structure, in which a metal layer of Cr/Al is formed as a first layer, then a mixed metal layer of Cr/Al and W/Ta/Mo/Nb is formed as a second layer, and then a metal layer of W/Ta/Mo/Nb is formed as a third layer, and then a carbide layer of W/Ta/Mo/Nb is formed as a fourth layer. Both of the carbide layers in JP-A-8-74032 (claims and paragraph 0007) and JP-A-2003-171758 (claims) show an intermediate composition between the substrate and the amorphous carbon (DLC) film, in which adhesion is improved by continuously changing a composition from the substrate to the amorphous carbon (DLC) film.

SUMMARY OF THE INVENTION

However, in the carbide intermediate layer, an amorphous carbide (for example, WC, TaC or MoC) sometimes grows to be crystalline at a high temperature of 300 to 400° C. and precipitates in the intermediate layer, and separation may occur at such a precipitated portion as a starting point.

It is desirable to provide an amorphous carbon (DLC) film having excellent adhesion at high temperature.

Furthermore, it is desirable to provide an amorphous carbon (DLC) film having excellent adhesion in a high load region.

As a result of earnest study, the inventors found that when a nitride or a carbo-nitride is used for the intermediate layer, adhesion of the amorphous carbon (DLC) film can be improved even at high temperature or in a high load region, and consequently completed an embodiment of the invention.

That is, an amorphous-carbon-based hard multilayer film according to the embodiment of the invention, which includes a base layer formed at a substrate side, a surface layer formed at a surface side, and a compositional gradient layer formed between the base layer and the surface layer, is summarized in that, the base layer includes a nitride or a carbo-nitride of an element M expressed by the following formula (1), the surface layer includes an amorphous carbon film containing C of 50 atomic percent or more, and the compositional gradient layer is a layer in which the element M and nitrogen are decreased, and carbon is increased from the base layer to the amorphous carbon film:

$$M_{1-x-y}C_xN_y \qquad (1),$$

(wherein M is at least one selected from a group 4A element in the periodic table, a group 5A element, a group 6A element, Al, and Si, and x and y denote atomic ratios in the formula, and x is 0.5 or less, y is 0.03 or more, and 1-x-y is more then 0).

The element M includes Ti, Zr, V, Nb, Ta, Cr, Mo, W, Al and Si, and preferably includes W, Mo and Ta. When the element M is W, Mo or Ta, the base layer is recommended to have an α-W structure, α-Mo structure or TaN structure.

A layer of an element including one selected from the group 4A element in the periodic table, the group 5A element, the group 6A element, Al, and Si may be formed between the substrate and the base layer.

The embodiment of the invention includes the substrate, and a hard surface member including the amorphous-carbon-based hard multilayer film formed on a surface of the substrate.

According to the embodiment of the invention, since the intermediate layer is formed by the base layer including a nitride or a carbo-nitride, and a layer in which a composition is changed from the base layer to the amorphous carbon (DLC) film, adhesion between the substrate and the amorphous carbon (DLC) film can be improved even at high temperature and in a high load region.

DETAILED DESCRIPTION OF THE PREFERRED EMBODIMENT

Figure 1:
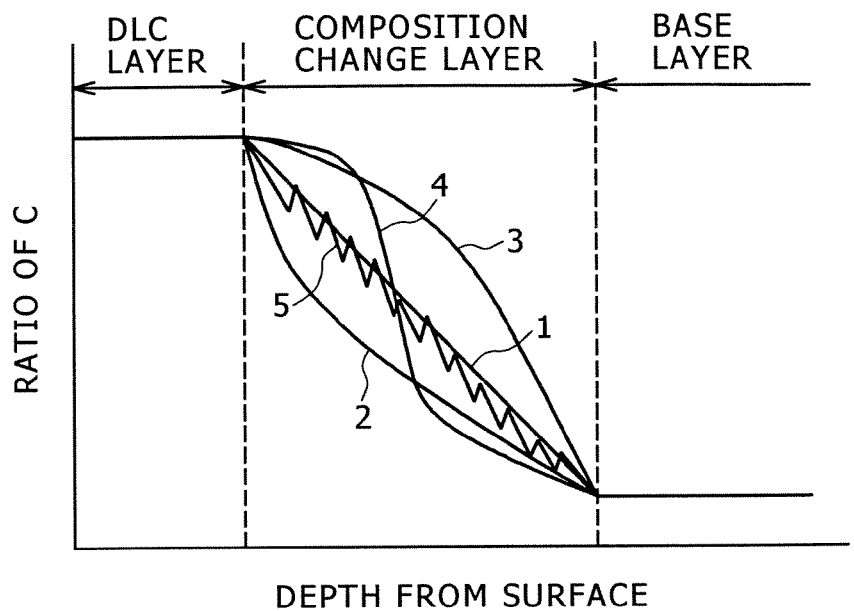
FIG. 1 shows a graph showing a composition change pattern of a compositional gradient layer of an embodiment of the invention.

It is desirable to improve adhesion of an amorphous carbon (DLC) film formed on a surface of a substrate. In the specification, the amorphous carbon (DLC) film includes an amorphous film containing only C (carbon), in addition, an amorphous film containing an element (for example, an element M of a base layer as described later) other than C in a range of C of 50 atomic percent or more (preferably, 70 atomic percent or more, and more preferably, 90 atomic percent or more). While a composition of the amorphous carbon (DLC) film is often specified by a ratio among C, N and the element M without considering hydrogen atoms, the amorphous carbon (DLC) film of an embodiment of the invention may contain hydrogen atoms, or may be hydrogen-free.

While thickness of the amorphous carbon (DLC) film is not particularly limited, for example, it is about 0.1 to 10 μm, preferably about 0.3 to 7 μm, and more preferably about 0.5 to 5 μm.

While a substrate typically includes a high hardness member such as cemented carbide or high speed tool steel, it also includes various kinds of iron-based materials (steel materials) such as bearing steel, stainless steel, and carbon steel.

In an embodiment of the invention, an intermediate layer is formed between the substrate and the amorphous carbon (DLC) film. The intermediate layer has a base layer formed at a substrate side, and a compositional gradient layer (graded layer) formed between the base layer and the amorphous carbon (DLC) film, and the intermediate layer acts to improve adhesion between the base layer and the amorphous carbon (DLC) film.

More particularly, the base layer includes a nitride or a carbo-nitride of an element M as expressed by the following formula (1):

$$M_{1-x-y}C_xN_y \quad (1)$$

(wherein x and y denotes atomic ratios.)

In the formula, the element M includes a group 4A element (such as Ti, Zr or Hf) in the periodic table, a group 5A element (such as V, Nb or Ta), a group 6A element (such as Cr, Mo or W), Al, and Si. Moreover, a reference M in the formula (1) denotes one of the elements, or a combination of at least two of the elements. The elements are useful for improving adhesion of the amorphous carbon (DLC) film. The embodiment of the invention characteristically uses a nitride or a carbo-nitride of the element M. The nitride or a carbo-nitride of the element M has high hardness, in addition, and is highly stabile at high temperature, so that change of a crystal structure can be suppressed.

Preferably, the element M is Ti, Zr, V, Nb, Ta, Cr, Me, W, Al or Si, and more preferably W, Mo or Ta. In the specification, the element M is sometimes referred to as metal irrespective of whether it contains Si or not.

When the element M is W or Mo, the base layer is recommended to have a body-centered cubic (bcc) structure (α-W structure, α-Mo structure or the like). When the element M is Ta, the base layer is recommended to have a TaN structure. Whether the element has the α-W structure, α-Mo structure, or TaN structure is determined by examining a crystal structure of the base layer by X-ray diffraction to determine whether intensity of a maximum peak of the α-W structure, α-Mo structure, or TaN structure is at least five time as large as intensity of peaks of other crystal structures.

In the formula (1), an atomic ratio of the element M (when the element M includes several kinds of elements, it is the total of atomic ratios of them, the atomic ratio (or the total of the atomic ratios) is expressed by 1-x-y in the formula (1)) is not particularly limited as long as it is more than 0, and determined according to a value of an atomic ratio (y) of N and an atomic ratio (x) of C as described later. However, for example, it may be in a range of about 0.4 to 0.97, preferably 0.5 to 0.95, and more preferably 0.6 to 0.9.

In the formula (1), N is essential, and the atomic ratio (y) of N is more than 0. Stability of the base layer at high temperature can be improved by containing N. While a preferable range of the atomic ratio (y) of N can be set depending on a kind of the element M, for example, it is 0.03 or more, preferably 0.1 or more, and more preferably 0.2 or more. While an upper limit of N is not particularly limited, and can be appropriately set in a range that the atomic ratio of M (1-x-y) is more than 0, for example, it is about 0.6 or less, preferably 0.5 or less, and more preferably 0.4 or less.

On the other hand, C is not essential in the formula (1), and the atomic ratio (x) of C may be 0, however, it may be 0.05 or more, and for example, may be 0.1 or more. Hardness of the base layer can be increased with increase in atomic ratio (x) of C. However, as C is increased, heat resistance of the base layer is reduced. Therefore, an upper limit of the atomic ratio (x) of C is determined to be 0.5, preferably 0.3, and more preferably 0.2.

Thickness of the base layer is, for example, 5 nm or more, preferably 10 nm or more, and more preferably 50 nm or more. As thickness of the base layer is increased, adhesion at high temperature or in a high load region can be improved more positively. While an upper limit of the base layer is not particularly limited, and can be appropriately set depending on application, temperature in use environment, or external stress, for example, it is about 100000 nm or less, preferably 1000 nm or less, and more preferably 300 nm or less.

In the compositional gradient layer formed between the base layer and the amorphous carbon (DLC) film, the amounts of the element M and nitrogen (N) are decreased from the base layer to the amorphous carbon (DLC) film, and the amount of carbon (C) is increased. The compositional gradient layer can prevent abrupt change in composition between the base layer and the amorphous carbon (DLC) film, consequently securely improve adhesion between them.

Composition change may be performed continuously or stepwise. Moreover, it may be performed straightly or curvedly. Furthermore, a composition may be changed monotonously or may be generally changed in a fixed direction while being repeatedly increased and decreased. FIG. 1 shows a graph showing an example of a change pattern of a ratio of C in the compositional gradient layer. In a first example (No. 1 in FIG. 1), the ratio of C is increased straightly, continuously and monotonously from the base layer to the amorphous carbon (DLC) film. In a second example (No. 2 in FIG. 1), a third example (No. 3 in FIG. 1) and a fourth example (No. 4 in FIG. 1), the ratio of C is increased curvedly, continuously and monotonously from the base layer to the amorphous carbon (DLC) film. More particularly, in the second example (No. 2), C is increased gently in an early stage and abruptly in a final stage from the base layer to the amorphous carbon (DLC) film. In the third example (No. 3), C is increased abruptly in the early stage and gently in the final stage from the base layer to the amorphous carbon (DLC) film. In the fourth example (No. 4), C is increased from the base layer to the amorphous carbon (DLC) film gently in the early stage and the final stage, and abruptly in a middle stage. In a fifth example (No. 5 in FIG. 1), the ratio of C is generally increased continuously from the base layer to the amorphous carbon (DLC) film while being repeatedly increased and decreased.

In the compositional gradient layer, the element M and nitrogen (N) increase or decrease behaving oppositely to carbon (C). For example, when carbon (C) is abruptly increased, the element M and nitrogen (N) are abruptly decreased, and when carbon (C) is gently increased, the element M and nitrogen (N) are gently decreased.

Thickness of the compositional gradient layer can be set in a range where discontinuity between the base layer and the amorphous carbon (DLC) film can be reduced, and for example, it is 5 nm or more, preferably 20 nm or more, and more preferably 100 nm or more. While an upper limit of the thickness of the compositional gradient layer is not particularly limited, it is typically about 20000 nm or less, and for example, about 5000 nm or less, in particular, about 1000 nm or less.

In the embodiment of the invention, a layer including at least one of the elements M (hereinafter, referred to as metal layer) may be formed between the substrate and the base layer. Depending on a combination of the base layer and the elements M, affinity between the substrate and the base layer is sometimes low, resulting in small effect of improving adhesion of the amorphous carbon (DLC) film. By forming the metal layer, the adhesion of the amorphous carbon (DLC) film can be sufficiently improved.

A preferable element M in the metal layer is different depending on a kind of the substrate. In the case of an iron-based substrate, the preferable element M in the metal layer (when there are a plurality of metal layers as described later, an element M of a metal layer at a side where the metal layers are contacted to the substrate) is Cr. In the case of a substrate of cemented carbide, the preferable element M of the metal layer (when there are a plurality of metal layers, an element M of a metal layer at a side where the metal layers are contacted to the substrate) is W.

A plurality of metal layers may be formed. Furthermore, a composition change reduction layer may be formed between the plurality of metal layers. The composition change reduction layer includes a compositional gradient layer (graduated layer) for continuously or stepwise changing a composition, or a mixed layer having a middle composition between metal layers on both sides. For example, it is acceptable that a Cr layer is formed on the substrate, then a layer (compositional gradient layer) in which a composition is gradually changed from Cr to W is formed, and then a W layer is formed thereon.

Thickness of the metal layer (in the case of a plurality of metal layers, it shows the total thickness of them, and in the case of further including the composition change reduction layer, it shows the total thickness of the metal layers and the composition change reduction layer, as similarly shown below) is, for example, more than 0 nm, preferably 5 nm or more, and more preferably 10 nm or more. However, when the metal layer is excessively large in thickness, overall the films including the base layer, compositional gradient layer, and amorphous carbon (DLC) film tend to be significantly changed by external force, consequently cracks or separation tend to occur in a coating. Therefore, an upper limit of thickness of the metal layer is, for example, 1000 nm or less, preferably 500 nm or less, and more preferably 100 nm or less (particularly 50 nm or less).

Any of the metal layer, base layer, compositional gradient layer, and amorphous carbon (DLC) film can be formed by appropriately adjusting a target and a deposition gas in an unbalanced magnetron sputtering process.

Since a stacked film (amorphous-carbon-based hard multilayer film) including the base layer, compositional gradient layer, and amorphous carbon (DLC) film (and metal layer as necessary) uses a nitride or a carbo-nitride in the base layer and the compositional gradient layer, it has excellent adhesion to the substrate even at high temperature or in a high load region. Therefore, a substrate having the amorphous-carbon-based hard multilayer film formed thereon can be used extremely advantageously for sliding members, dies, cutting tools (particularly, cutting tools for nonferrous metals), wear-resistant machine parts, abradants, magnetic/optical components and the like.

EXAMPLES

While the embodiment of the invention will be described more specifically with examples below, it will be appreciated that the embodiment of the invention is not limited by the following examples, and can be obviously carried out while being appropriately altered or modified within the scope where it meets the gist as described before and later, and any of such alterations or modifications is included in the technical scope of the embodiment of the invention.

Example 1

Unbalanced magnetron sputtering apparatus having four evaporation sources (6 inches in target diameter) was used, and a target including each of elements M shown in the following Table 1 was mounted for two evaporation sources, and a carbon target was mounted for the remained, two evaporation sources. Mirror-polished substrates (cemented carbide (JIS-P20) substrate and high speed tool steel (JIS-SKH51, HRC63)) substrate were subjected to ultrasonic cleaning in ethanol, and then mounted on a turntable in a chamber of the sputtering apparatus. The chamber was evacuated (to a pressure of $1 \times 10^{-3}$ Pa), and the substrates were heated to about 200° C. and then etched by Ar ions.

Next, a base layer, compositional gradient layer, and DLC layer as shown in the following Table 1 were formed in this order as follows.

1) Base Layer

A predetermined, atmospheric gas was introduced into the chamber, and each of the targets including the element M was supplied with electric power of 2 kW to be sputtered, thereby a base layer was formed on a surface of each of the substrates. The atmospheric gas was properly used as follows depending on a kind of the base layer.

1-1) In the Case of Only Element M (Such as Cr or W):
  Ar gas
  total pressure: 0.6 Pa 1-2) In the Case of Carbide of Element M (Such as TiC):
  Ar—$CH_4$ mixed gas
  Ar/$CH_4$=6/4 (volume ratio)
  total pressure: 0.6 Pa 1-3) In the Case of Nitride of Element M (Such as ZrN, TaN, CrN, WN, MoN, AlN or WMoN):
  Ar—$N_2$ mixed gas
  Ar/$N_2$=7/3 (volume ratio)
  total pressure: 0.6 Pa 1-4) In the Case of Carbo-Nitride of Element M (Such as TiCN, VCN or SiCN):
  Ar—$N_2$—$CH_4$ mixed gas
  Ar/$N_2$/$CH_4$=5/2/3 (volume ratio)
  total pressure: 0.6 Pa 2) Compositional Gradient Layer The carbon target was supplied with electric power of 0.05 kW. Thereafter, electric power to the carbon target was increased gradually monotonously, and finally 2.5 kW was supplied. Concurrently with increase in electric power to the carbon target, electric power to the target including the element M was decreased gradually monotonously, and finally 0 kW was supplied. Furthermore, a ratio of $N_2$ in the atmospheric gas was decreased gradually monotonously, and concurrently, a ratio of $CH_4$ was increased gradually monotonously, and finally the Ar—$CH_4$ mixed gas (Ar/$CH_4$=9/1 (volume ratio), total pressure: 0.6 Pa) was given.

3) DLC Layer

A predetermined, atmospheric gas was introduced into the chamber, and the target including the element M and the carbon target were supplied with predetermined electric power to be sputtered, thereby a DLC layer was formed. The atmospheric gas and supply power were properly used as follows depending on a kind of the DLC layer.

3-1) In the Case of Only Carbon:
  supply power to carbon target: 2.5 kW
  supply power to target of element M: 0 kW
  Ar—$CH_4$ mixed gas
  Ar/$CH_4$=9/1 (volume ratio)
  total pressure: 0.6 Pa 3-2) In the Case of DLC Containing Element M (Such as W-Contained DLC):
  supply power to carbon target: 2.5 kW
  supply power to target of element M: 0.5 kW (in the case that element M is W)
  Ar—$CH_4$ mixed gas
  Ar/$CH_4$=9/1 (volume ratio)
  total pressure: 0.6 Pa A scratch test was performed to evaluate adhesion of obtained DLC layers. In the scratch test, while a sample was moved at a moving speed of 10 mm/min, a surface of the sample was pressed by a diamond indenter of which the tip has a radius of curvature of 200 μm. While press load was increased at a load increase speed of 100 N/min (maximum load of 100 N), load at which delamination was able to be observed in a coating (critical load) was examined.

Results are shown in Table 1. Thickness of each layer was determined by TEM observation of a cross section of a sample.

TABLE 1

| | Base Layer | | | Composition Change Layer | | DLC Layer | | Adhesion (Critical Load (N)) | |
|---|---|---|---|---|---|---|---|---|---|
| No. | Element M (Target) | Composition (Atomic Ratio) | Thickness (nm) | Type* | Thickness (nm) | Composition (Atomic Ratio) | Thickness (μm) | Sintered Hard Alloy | High Speed Tool Alloy |
| 1 | not used | Do not exist | 0 | not used | 0 | C | 2 | 10 | 5 |
| 2 | Ti | $Ti_{0.5}C_{0.5}$ | 50 | 1 | 500 | C | 2 | 50 | 40 |
| 3 | Cr | Cr | 50 | 1 | 500 | C | 2 | 60 | 50 |
| 4 | W | W | 50 | 1 | 500 | C | 2 | 70 | 60 |
| 5 | Ti | $Ti_{0.5}C_{0.25}N_{0.25}$ | 100 | 1 | 500 | C | 2 | 80 | 50 |
| 6 | Zr | $Zr_{0.5}N_{0.5}$ | 100 | 1 | 500 | C | 2 | 80 | 50 |
| 7 | V | $V_{0.5}C_{0.4}N_{0.1}$ | 100 | 1 | 500 | C | 2 | 80 | 60 |
| 8 | Ta | $Ta_{0.5}N_{0.5}$ | 100 | 1 | 500 | C | 2 | 100 or more | 70 |
| 9 | Cr | $Cr_{0.5}N_{0.5}$ | 100 | 1 | 500 | C | 2 | 80 | 65 |
| 10 | W | $W_{0.75}N_{0.25}$ | 100 | 1 | 500 | C | 2 | 100 or more | 80 |
| 11 | Mo | $Mo_{0.4}N_{0.6}$ | 100 | 1 | 500 | C | 2 | 100 or more | 80 |
| 12 | Al | $Al_{0.5}N_{0.5}$ | 100 | 1 | 500 | C | 2 | 80 | 65 |
| 13 | Si | $Si_{0.4}C_{0.2}N_{0.4}$ | 100 | 1 | 500 | C | 2 | 85 | 75 |
| 14 | W | $W_{0.75}N_{0.25}$ | 100 | 1 | 500 | $C_{0.9}W_{0.1}$ | 2 | 100 or more | 80 |
| 15 | $W_{0.8}Mo_{0.2}$ | $W_{0.65}Mo_{0.1}N_{0.25}$ | 100 | 1 | 500 | C | 2 | 100 or more | 85 |

*See FIG. 1

As clear from comparison between Nos. 2, 3 and 4 and Nos. 5, 9 and 10 in Table 1, compared with the case that the base layer and the compositional gradient layer do not contain N atoms (Nos. 2, 3 and 4), in the case that they contain N atoms (Nos. 5, 9 and 10), adhesion of the DLC layer is improved. The effect of improving the adhesion of the DLC layer by containing N atoms in the base layer and the compositional gradient layer is achieved in various kinds of elements M (Nos. 6 to 8 and 11 to 15).

Example 2

A base layer, compositional gradient layer, and DLC layer as shown in the following Table 2 were formed and evaluated in the same way as in the example 1. A crystal structure of the base layer was examined by X-ray diffraction (CuKα line, 40 kV-40 mA) using the θ-2θ method, and a crystal structure corresponding to a peak having the highest intensity was determined as a crystal structure of the base layer.

Results are shown in Table 2. In the table, each sample in which a crystal structure of the base layer is made to be the α-W structure, α-Mo structure or TaN structure exhibits intensity of a maximum peak of the α-W structure, α-Mo structure, or TaN structure, showing at least five times as large as intensity of peaks of other crystal structures.

TABLE 2

| No. | Base Layer Element M (Target) | Base Layer Composition (Atomic Ratio) | Base Layer Thickness (nm) | Base Layer Crystal Structure | Composition Change Layer Type* | Composition Change Layer Thickness (nm) | DLC layer Composition (Atomic Ratio) | DLC layer Thickness (μm) | Adhesion (Critical Load (N)) Sintered Hard Alloy | Adhesion (Critical Load (N)) High Speed Tool Alloy |
|---|---|---|---|---|---|---|---|---|---|---|
| 1 | W | $W_{0.4}N_{0.6}$ | 100 | $W_2N$ | 1 | 500 | C | 2 | 80 | 75 |
| 2 | W | $W_{0.7}N_{0.3}$ | 100 | $W_2N$ | 1 | 500 | C | 2 | 80 | 75 |
| 3 | W | $W_{0.8}N_{0.2}$ | 100 | αW | 1 | 500 | C | 2 | 100 or more | 90 |
| 4 | W | $W_{0.9}N_{0.1}$ | 100 | αW | 1 | 500 | C | 2 | 100 or more | 80 |
| 5 | W | $W_{0.95}N_{0.05}$ | 100 | αW | 1 | 500 | C | 2 | 95 | 85 |
| 6 | W | $W_{0.97}N_{0.03}$ | 100 | αW | 1 | 500 | C | 2 | 90 | 75 |
| 7 | W | W | 100 | αW | 1 | 500 | C | 2 | 70 | 60 |
| 8 | Mo | $Mo_{0.4}N_{0.6}$ | 100 | MoN | 1 | 500 | C | 2 | 75 | 65 |
| 9 | Mo | $Mo_{0.7}N_{0.3}$ | 100 | $Mo_2N$ | 1 | 500 | C | 2 | 85 | 60 |
| 10 | Mo | $Mo_{0.8}N_{0.2}$ | 100 | αMo | 1 | 500 | C | 2 | 100 or more | 80 |
| 11 | Mo | $Mo_{0.9}N_{0.1}$ | 100 | αMo | 1 | 500 | C | 2 | 100 or more | 80 |
| 12 | Mo | $Mo_{0.95}N_{0.05}$ | 100 | αMo | 1 | 500 | C | 2 | 95 | 75 |
| 13 | Mo | $Mo_{0.97}N_{0.03}$ | 100 | αMo | 1 | 500 | C | 2 | 90 | 75 |
| 14 | Mo | Mo | 100 | αMo | 1 | 500 | C | 2 | 65 | 55 |
| 15 | Ta | $Ta_{0.5}N_{0.5}$ | 100 | TaN | 1 | 500 | C | 2 | 95 | 80 |
| 16 | Ta | $Ta_{0.7}N_{0.3}$ | 100 | $Ta_2N$ | 1 | 500 | C | 2 | 95 | 75 |
| 17 | Ta | $Ta_{0.9}N_{0.1}$ | 100 | $Ta_2N$ | 1 | 500 | C | 2 | 85 | 75 |
| 18 | Ta | $Ta_{0.97}N_{0.03}$ | 100 | αTa | 1 | 500 | C | 2 | 80 | 70 |
| 19 | Ta | Ta | 100 | αTa | 1 | 500 | C | 2 | 70 | 50 |

*See FIG. 1

As clear from Table 2, when the base layer has the α-W structure, α-Mo structure, or TaN structure, adhesion is further improved compared with the case that the base layer has another crystal structure.

Figure 2:
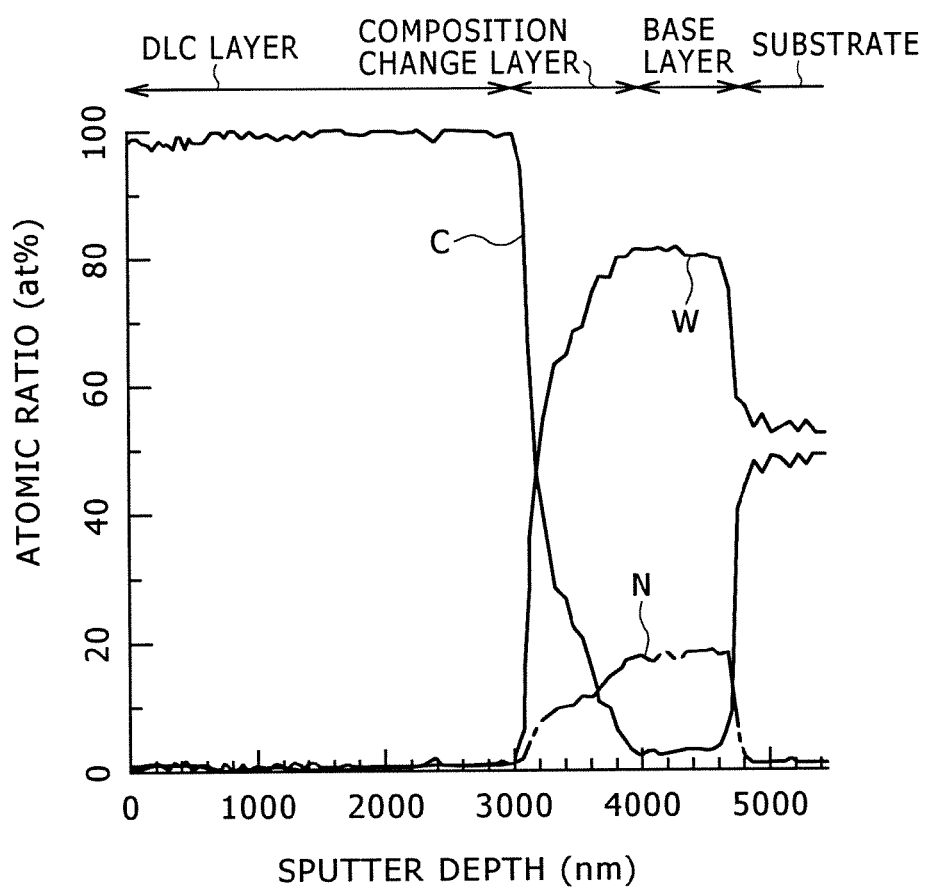
FIG. 2 shows a graph showing a component of an amorphous-carbon-based hard multilayer film of No. 10 in example 2.

In No. 10 in Table 2, a coating formed on the substrate of the cemented carbide (WC—Co) was subjected to sputtering, and a composition corresponding to sputter depth was measured by Auger spectroscopy. Results are shown in FIG. 2. As clear from FIG. 2, the compositional gradient layer was changed in composition similarly as in the type 1 of FIG. 1.

Example 3

A base layer, compositional gradient layer, and DLC layer as shown in the following Table 3 were formed and evaluated in the same way as in the example 1. In samples of Nos. 19 to 23, a composition change pattern of the compositional gradient layer was variously changed as shown in FIG. 1.

TABLE 3

| No. | Base Layer Element M (Target) | Base Layer Composition (Atomic Ratio) | Base Layer Thickness (nm) | Composition Change Layer Type* | Composition Change Layer Thickness (nm) | DLC Layer Composition (Atomic Ratio) | DLC Layer Thickness (μm) | Adhesion (Critical Load (N)) Sintered Hard Alloy | Adhesion (Critical Load (N)) High Speed Tool Alloy |
|---|---|---|---|---|---|---|---|---|---|
| 1 | W | W0.8N0.2 | 100 | 1 | 500 | C | 2 | 100 or more | 90 |
| 2 | W | W0.7C0.1N0.2 | 100 | 1 | 500 | C | 2 | 100 or more | 85 |
| 3 | W | W0.5C0.3N0.2 | 100 | 1 | 500 | C | 2 | 80 | 75 |
| 4 | W | W0.4C0.5N0.1 | 100 | 1 | 500 | C | 2 | 80 | 70 |
| 5 | W | W0.4C0.6 | 100 | 1 | 500 | C | 2 | 70 | 60 |
| 6 | Mo | Mo0.85N0.15 | 0 | 1 | 500 | C | 2 | 50 | 45 |
| 7 | Mo | Mo0.85N0.15 | 5 | 1 | 500 | C | 2 | 70 | 65 |
| 8 | Mo | Mo0.85N0.15 | 10 | 1 | 500 | C | 2 | 95 | 85 |
| 9 | Mo | Mo0.85N0.15 | 100 | 1 | 500 | C | 2 | 100 or more | 85 |
| 10 | Mo | Mo0.85N0.15 | 200 | 1 | 500 | C | 2 | 100 or more | 85 |
| 11 | Mo | Mo0.85N0.15 | 2000 | 1 | 500 | C | 2 | 100 or more | 80 |
| 12 | Mo | Mo0.85N0.15 | 100000 | 1 | 500 | C | 2 | 100 or more | 80 |
| 13 | W | W0.8N0.2 | 100 | 1 | 0 | C | 2 | 50 | 40 |
| 14 | W | W0.8N0.2 | 100 | 1 | 5 | C | 2 | 90 | 85 |
| 15 | W | W0.8N0.2 | 100 | 1 | 20 | C | 2 | 95 | 85 |
| 16 | W | W0.8N0.2 | 100 | 1 | 100 | C | 2 | 100 or more | 90 |
| 17 | W | W0.8N0.2 | 100 | 1 | 1000 | C | 2 | 100 or more | 90 |
| 18 | W | W0.8N0.2 | 100 | 1 | 20000 | C | 2 | 100 or more | 90 |
| 19 | Ta | Ta0.5N0.5 | 100 | 1 | 500 | C | 2 | 95 | 85 |
| 20 | Ta | Ta0.5N0.5 | 100 | 2 | 500 | C | 2 | 95 | 85 |
| 21 | Ta | Ta0.5N0.5 | 100 | 3 | 500 | C | 2 | 95 | 85 |
| 22 | Ta | Ta0.5N0.5 | 100 | 4 | 500 | C | 2 | 90 | 80 |
| 23 | Ta | Ta0.5N0.5 | 100 | 5 | 500 | C | 2 | 95 | 85 |

*See FIG. 1

As clear from Nos. 1 to 5 in Table 3, adhesion is excellent in the case that a composition of the basic layer includes a carbo-nitride or a nitride of the element M compared with the case that it includes a carbide of the element M. Moreover, as clear from Nos. 6 to 18 in Table 3, adhesion is improved with increase in thickness of the base layer or the compositional gradient layer. Furthermore, as clear from Nos. 19 to 23 in Table 3, even if the composition change pattern of the compositional gradient layer is variously changed, adhesion of the DLC layer can be improved.

Example 4

Nos. 1 to 17

Each target X shown in the following Table 4, a target including an element M shown in the following Table 4, and a carbon target were mounted for evaporation sources of unbalanced magnetron sputtering apparatus. Mirror-polished substrates (cemented carbide (JIS-P20) substrate and high speed tool steel (JIS-SKH51, HRC63) substrate were subjected to ultrasonic cleaning in ethanol, then mounted on a turntable in a chamber of the sputtering apparatus. The chamber was evacuated (to a pressure of $1 \times 10^{-3}$ Pa), and the substrates were heated to about 200° C. and then etched by Ar ions.

Ar gas (0.6 Pa) was introduced into the chamber, and the target X was supplied with electric power of 2 kW to be sputtered, thereby a metal layer was formed on surfaces of the substrates. Then, a base layer, compositional gradient layer, and DLC layer as shown in the following Table 4 were formed in this order in the same way as in the example 1.

No. 18

No. 18 was formed in the same way as No. 7 except that a first metal layer including Cr and a second metal layer including W were formed, in addition, a compositional gradient layer (graded layer), in which Cr was decreased, and W was increased from the first metal layer to the second metal layer, was formed between the first and second metal layers.

TABLE 4

| No. | Metal Layer Composition (Target X) | Metal Layer Thickness (nm) | Second Metal Layer Composition (Target X) | Second Metal Layer Thickness (nm) | Base Layer Metal M (Target) | Base Layer Composition (Atomic Ratio) | Base Layer Thickness (nm) |
|---|---|---|---|---|---|---|---|
| 1 | Ti | 20 | — | — | W | $W_{0.8}N_{0.2}$ | 100 |
| 2 | Zr | 20 | — | — | W | $W_{0.8}N_{0.2}$ | 100 |
| 3 | Hf | 20 | — | — | W | $W_{0.8}N_{0.2}$ | 100 |
| 4 | V | 20 | — | — | W | $W_{0.8}N_{0.2}$ | 100 |
| 5 | Nb | 20 | — | — | W | $W_{0.8}N_{0.2}$ | 100 |
| 6 | Ta | 20 | — | — | W | $W_{0.8}N_{0.2}$ | 100 |
| 7 | Cr | 20 | — | — | W | $W_{0.8}N_{0.2}$ | 100 |
| 8 | Mo | 20 | — | — | W | $W_{0.8}N_{0.2}$ | 100 |
| 9 | W | 20 | — | — | W | $W_{0.8}N_{0.2}$ | 100 |
| 10 | Al | 20 | — | — | W | $W_{0.8}N_{0.2}$ | 100 |
| 11 | Si | 20 | — | — | W | $W_{0.8}N_{0.2}$ | 100 |
| 12 | W | 10 | — | — | W | $W_{0.8}N_{0.2}$ | 100 |
| 13 | W | 50 | — | — | W | $W_{0.8}N_{0.2}$ | 100 |
| 14 | W | 100 | — | — | W | $W_{0.8}N_{0.2}$ | 100 |
| 15 | W | 500 | — | — | W | $W_{0.8}N_{0.2}$ | 100 |
| 16 | W | 1000 | — | — | W | $W_{0.8}N_{0.2}$ | 100 |
| 17 | $Cr_{0.5}Ti_{0.5}$ | 20 | — | — | W | $W_{0.8}N_{0.2}$ | 100 |
| 18 | Cr | 20 | W | 20 | W | $W_{0.8}N_{0.2}$ | 100 |

| No. | Composition Change Layer Type* | Composition Change Layer Thickness (nm) | DLC layer Composition (Atomic Ratio) | DLC layer Thickness (μm) | Adhesion (Critical Load (N)) Sintered Hard Alloy | Adhesion (Critical Load (N)) High Speed Tool Alloy |
|---|---|---|---|---|---|---|
| 1 | 1 | 500 | C | 2 | 100 or more | 100 or more |
| 2 | 1 | 500 | C | 2 | 100 or more | 100 or more |
| 3 | 1 | 500 | C | 2 | 100 or more | 100 or more |
| 4 | 1 | 500 | C | 2 | 100 or more | 100 or more |
| 5 | 1 | 500 | C | 2 | 100 or more | 100 or more |
| 6 | 1 | 500 | C | 2 | 100 or more | 100 or more |
| 7 | 1 | 500 | C | 2 | 100 or more | 100 or more |
| 8 | 1 | 500 | C | 2 | 100 or more | 100 or more |
| 9 | 1 | 500 | C | 2 | 100 or more | 100 or more |
| 10 | 1 | 500 | C | 2 | 100 or more | 100 or more |
| 11 | 1 | 500 | C | 2 | 100 or more | 100 or more |
| 12 | 1 | 500 | C | 2 | 100 or more | 100 or more |
| 13 | 1 | 500 | C | 2 | 100 or more | 100 or more |
| 14 | 1 | 500 | C | 2 | 95 | 90 |
| 15 | 1 | 500 | C | 2 | 90 | 85 |
| 16 | 1 | 500 | C | 2 | 90 | 80 |
| 17 | 1 | 500 | C | 2 | 100 or more | 100 or more |
| 18 | 1 | 500 | C | 2 | 100 or more | 100 or more |

*See FIG. 1

As clear from Table 4, adhesion of the DLC layer can be further improved by forming the metal layer/layers.

What is claimed is:

1. An amorphous-carbon-based hard multilayer film formed on a substrate, comprising:
   a base layer formed at a substrate side;
   a surface layer formed at a surface side; and
   a compositional gradient layer formed between the base layer and the surface layer,
   wherein the base layer comprises a nitride or a carbonitride of an element M expressed by the following formula (1),
   the surface layer comprises an amorphous carbon film comprising C of 50 atomic percent or more, and
   the compositional gradient layer is a layer in which the element M and nitrogen are decreased, and carbon is increased from the base layer to the amorphous carbon film:

$$M_{1-x-y}C_xN_y \quad (1)$$

wherein M comprises at least one selected from the group consisting of W, Mo and Ta; x and y denote atomic ratios; x is 0.5 or less; y is 0.03 or more; 1-x-y is more than 0, and wherein when a crystal structure of the base layer is examined by X-ray diffraction, an intensity of a maximum peak of an α-W structure, α-Mo structure, or TaN structure is at least five times as large as an intensity of peaks of other crystal structures.

2. The amorphous-carbon-based hard multilayer film according to claim 1,
   wherein the element M comprises at least one selected from the group consisting of Ti, Zr, V, Nb, Ta, Cr, Mo, W, Al and Si.

3. The amorphous-carbon-based hard multilayer film according to claim 1,
   wherein a layer of an element comprising at least one of the group 4A element in the periodic table, the group 5A element, the group 6A element, Al, and Si is formed between the substrate and the base layer.

4. The amorphous-carbon-based hard multilayer film according to claim 1,
   wherein a layer of an element comprising at least one of the group 4A element in the periodic table, the group 5A element, the group 6A element, Al, and Si is formed between the substrate and the base layer.

5. A hard surface member, comprising a substrate, and the amorphous-carbon-based hard multilayer film according to claim 4 formed on a surface of the substrate.

6. A hard surface member, comprising a substrate and the amorphous-carbon-based hard multilayer film according to claim 1 formed on a surface of the substrate.

7. The amorphous-carbon-based hard multilayer film formed on a substrate according to claim 1, comprising:
   a base layer formed at a substrate side;
   a surface layer formed at a surface side; and
   a compositional gradient layer formed between the base layer and the surface layer,
   wherein the base layer comprises a nitride or a carbonitride of an element M expressed by the following formula (1),
   the surface layer comprises an amorphous carbon film comprising C of 50 atomic percent or more, and
   the compositional gradient layer is a layer in which the element M and nitrogen are decreased, and carbon is increased from the base layer to the amorphous carbon film:

$$M_{1-x-y}C_xN_y \quad (1)$$

wherein M comprises at least one selected from the group consisting of W, Mo and Ta; x and y denote atomic ratios; x is less than 0.5; y is 0.03 or more; and 1-x-y is more than 0.

8. The amorphous-carbon-based hard multilayer film according to claim 1, comprising:
   a base layer formed at a substrate side;
   a surface layer formed at a surface side; and
   a compositional gradient layer formed between the base layer and the surface layer,
   wherein the base layer comprises a nitride or a carbonitride of an element M expressed by the following formula (1),
   the surface layer comprises an amorphous carbon film comprising C of 50 atomic percent or more, and
   the compositional gradient layer is a layer in which the element M and nitrogen are decreased, and carbon is increased from the base layer to the amorphous carbon film:

$$M_{1-x-y}C_xN_y \quad (1)$$

wherein, M comprises at least one selected from the group consisting of W, Mo and Ta; x and y denote atomic ratios; x is more than 0.05 and less than 0.5; y is 0.03 or more; and 1-x-y is more than 0.

9. The amorphous-carbon-based hard multilayer film according to claim 1, wherein the substrate comprises cemented carbide and a critical load of the amorphous-carbon-based hard multilayer film on the substrate is higher than 70 N.

10. The amorphous-carbon-based hard multilayer film according to claim 1, wherein the substrate comprises high speed tool steel and a critical load of the amorphous-carbon-based hard multilayer film on the substrate is higher than 60 N.

* * * * *